United States Patent [19]

Dandl

[11] Patent Number: 5,133,826
[45] Date of Patent: Jul. 28, 1992

[54] ELECTRON CYCLOTRON RESONANCE PLASMA SOURCE

[75] Inventor: Raphael A. Dandl, San Marcos, Calif.

[73] Assignee: Applied Microwave Plasma Concepts, Inc., Carlsbad, Calif.

[21] Appl. No.: 320,947

[22] Filed: Mar. 9, 1989

[51] Int. Cl.$^5$ .............................................. H01L 21/00
[52] U.S. Cl. ..................... 156/345; 156/643; 118/50.1; 118/723
[58] Field of Search .................. 156/345, 643; 427/47; 118/50.1, 723

[56] References Cited

U.S. PATENT DOCUMENTS

| | | | |
|---|---|---|---|
| 4,745,337 | 5/1988 | Pichot et al. | 204/298.37 X |
| 4,776,918 | 10/1988 | Otsubo et al. | 118/728 |
| 4,778,561 | 10/1988 | Ghanbari | 156/345 |
| 4,844,767 | 7/1989 | Okudaira et al. | 156/345 |

Primary Examiner—Richard Bueker
Assistant Examiner—Thi Dang
Attorney, Agent, or Firm—Robert C. Hill; John A. Bucher

[57] ABSTRACT

A method and apparatus are disclosed employing electron cyclotron resonant (ECR) heating to produce plasma for applications including but not limited to chemical vapor deposition and etching. A magnetic field is formed by magnets circumferentially arranged about a cylindrical and symmetrical chamber with microwave power injected perpendicularly to a longitudinal axis of the chamber for preventing line-of-sight communication of resulting energetic electrons through an outlet at one axial end of the chamber. The circumferential magnets in the symmetrical chamber cause precessing of the electrons resulting in greatly increased plasma density and ion flux or current density even at low gas pressures which are preferably maintained for establishing unidirectionality or anisotropic plasma characteristics. A magnetic field free region is formed between the plasma forming region containing the microwave power source and the circumferential magnets in order to also produce uniformity of plasma distribution in a plasma stream approaching the outlet. Thus, with specimens aranged in communication with the outlet, the above characteristics are maintained for the plasma stream over substantial transverse dimensions larger than the specimen.

17 Claims, 5 Drawing Sheets

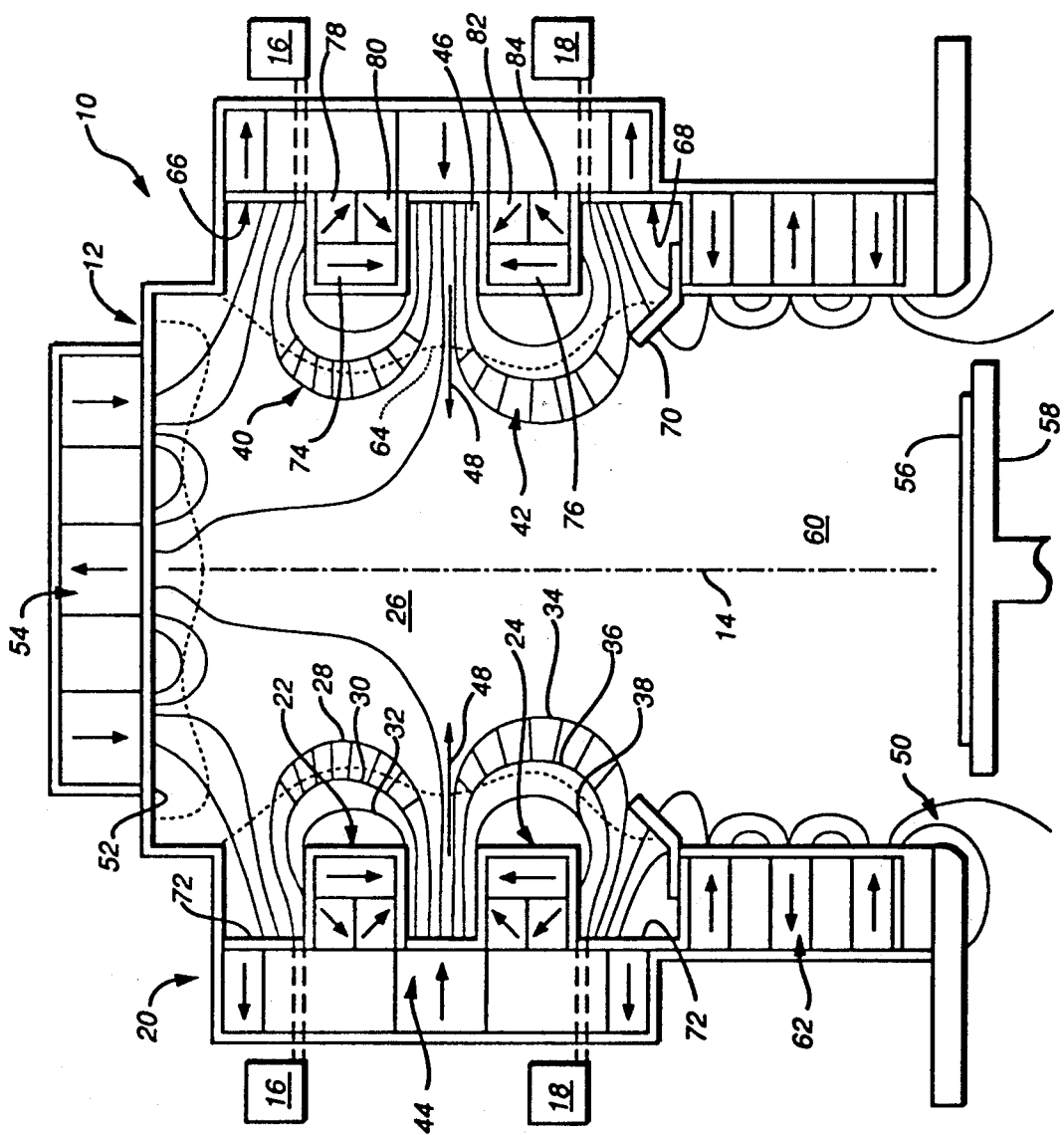
FIG._1

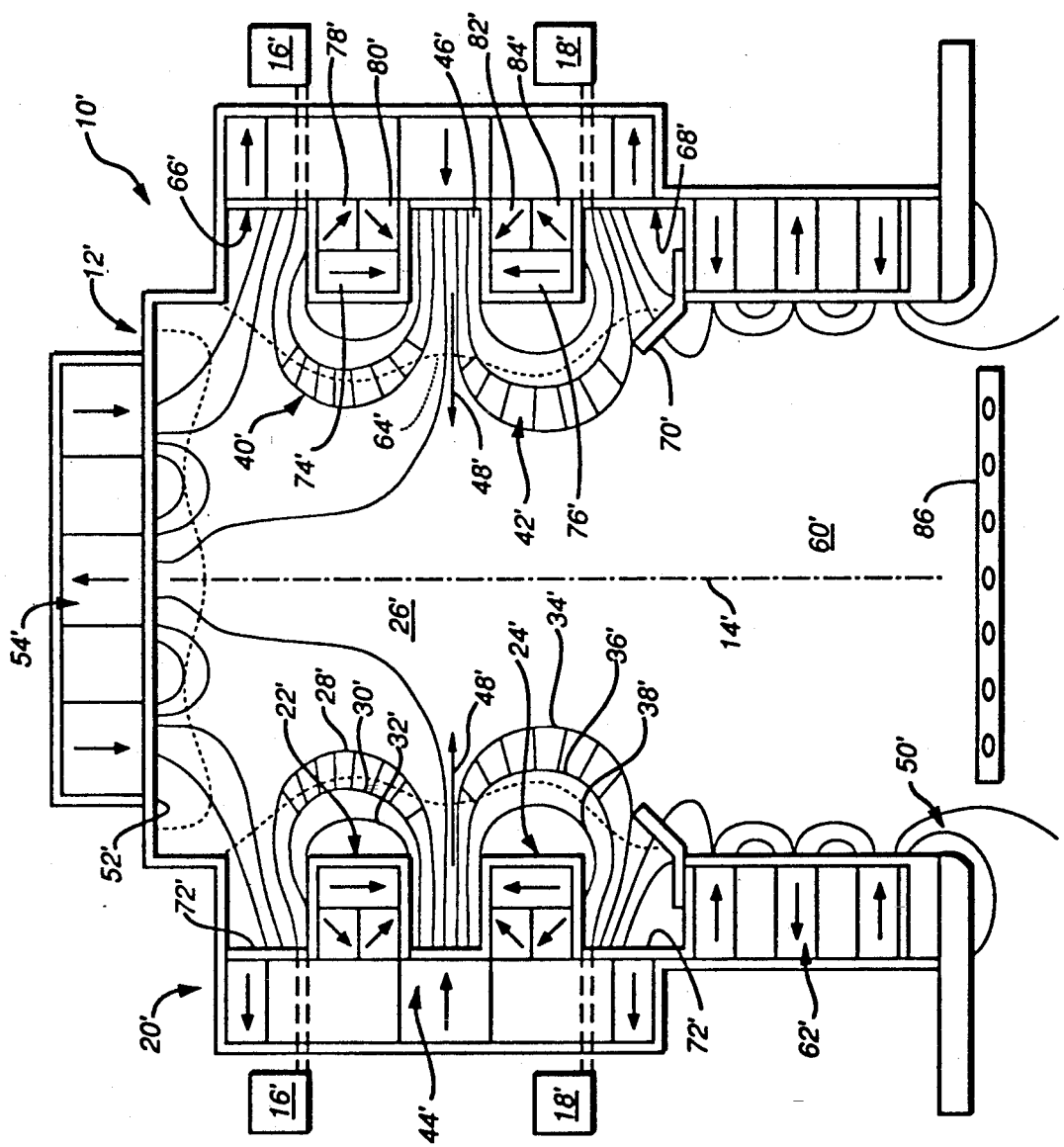
FIG._2

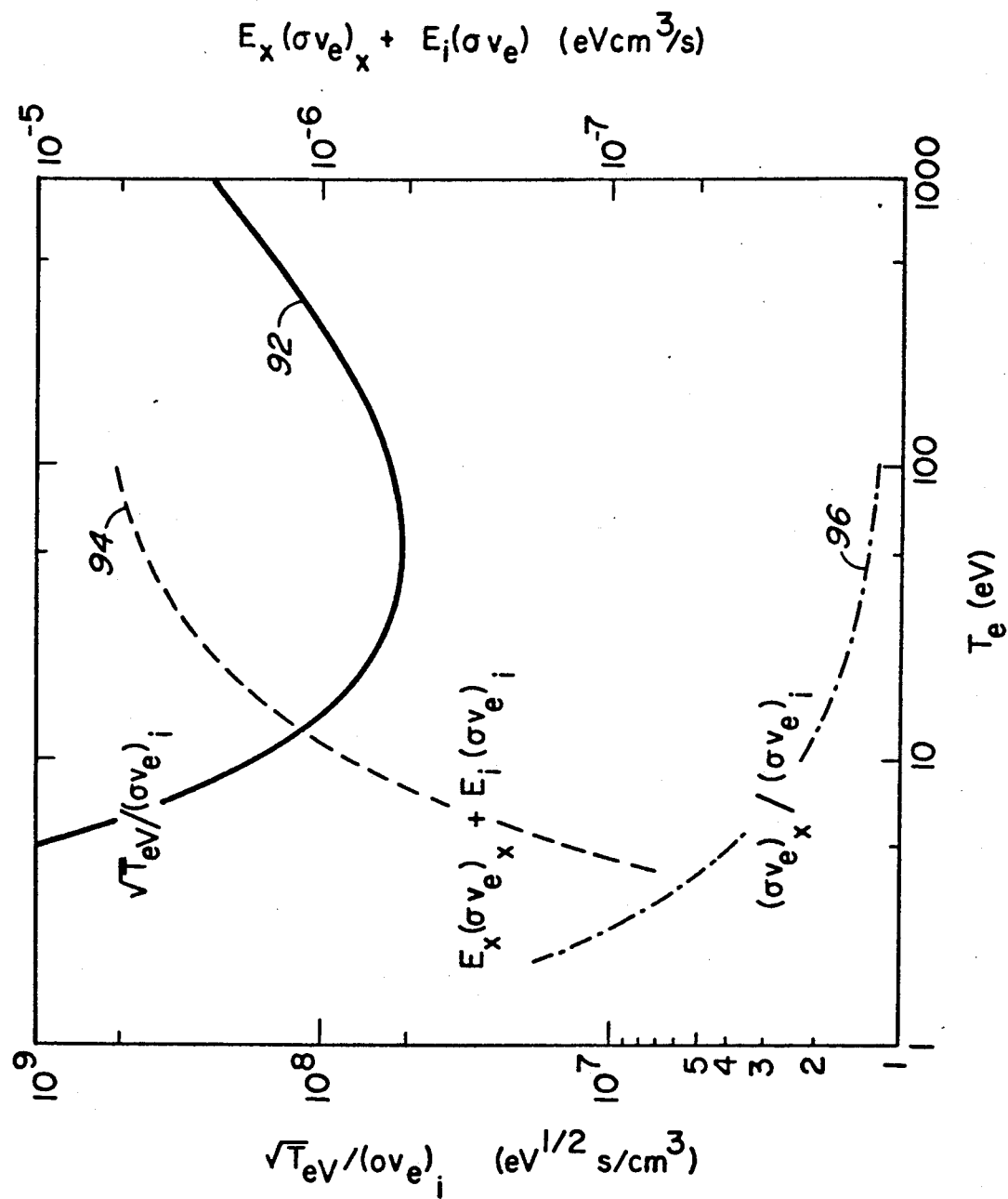
FIG._3.

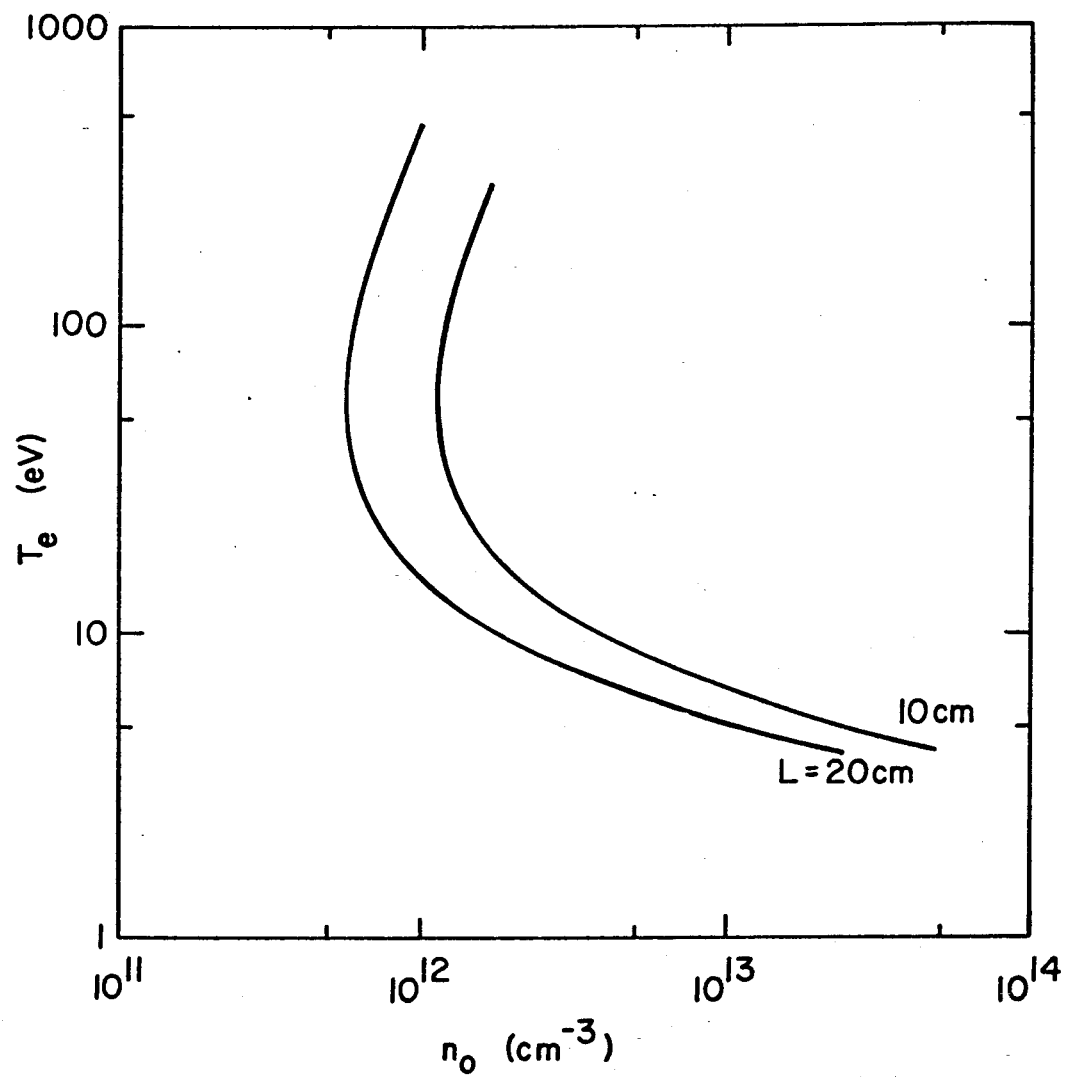
FIG._4.

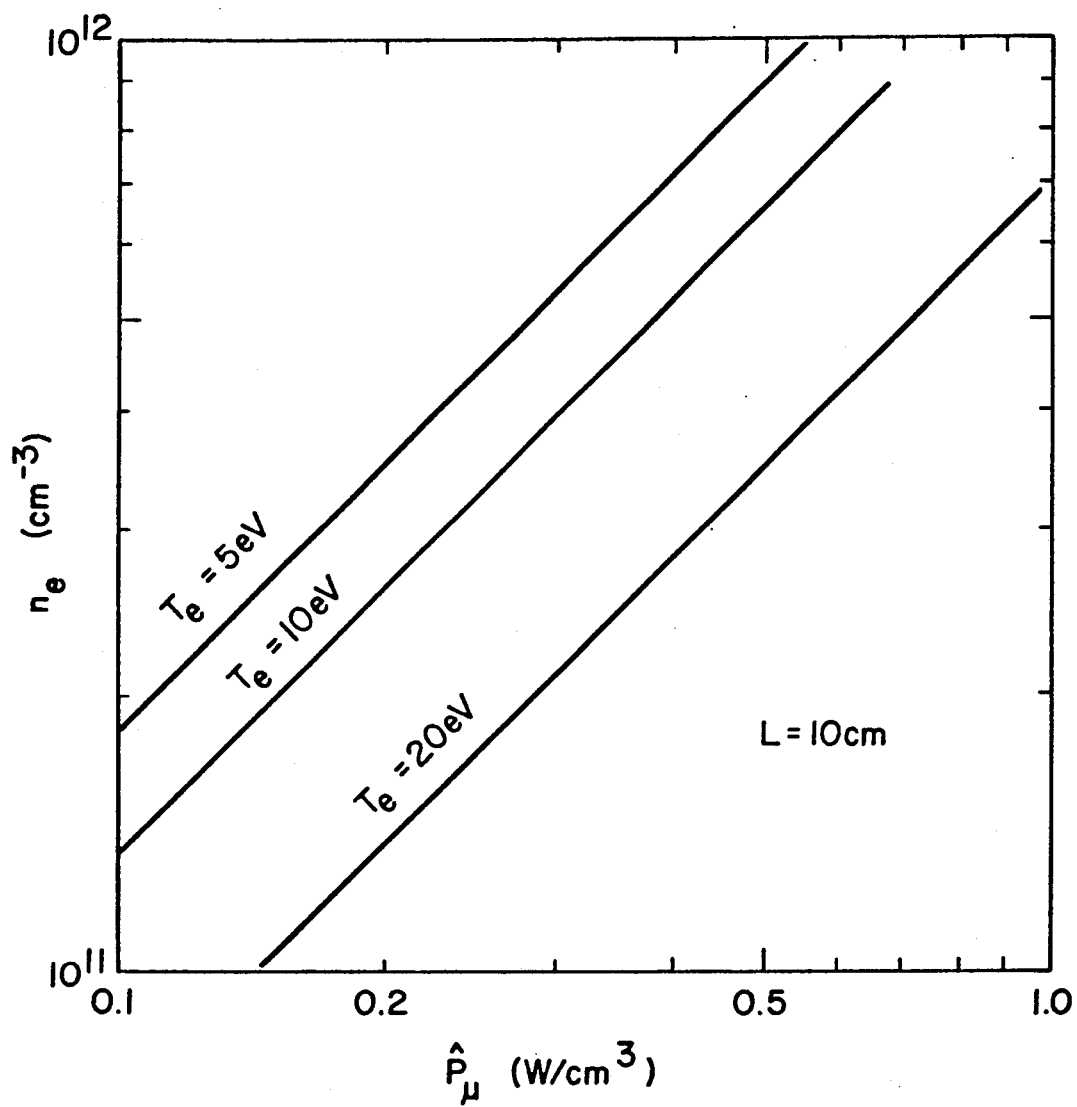
FIG._5.

5,133,826

ELECTRON CYCLOTRON RESONANCE PLASMA SOURCE

FIELD OF THE INVENTION

The present invention relates to a method and apparatus employing electron cyclotron resonance heating for producing a plasma stream and more particularly to a method and apparatus employing such a plasma source for use in applications such as a negative ion source or the treatment or specimens such as VLSI wafers by applications including chemical vapor deposition and etching carried out by means of the plasma stream.

BACKGROUND OF THE INVENTION

The present invention is based upon generation of cold plasma by electron cyclotron resonance heating in order to develop various desired characteristics within the plasma. Thus, the present invention and related prior art are based upon criteria where conditions governing steady-state values of plasma density, electron temperature and neutral gas pressure in the cold plasma created or developed by ionization of gas are determined by particle and power balances for each of three coupled species; namely electrons, ions and gas atoms.

Even in idealized point-model approximations of full transport models, inter-related values of the basic plasma parameters present for all such systems demonstrate key dependencies which indicate some of the fundamental obstacles which make it difficult in practice to achieve large volumes of homogeneous plasma. Such larg volumes of homogeneous plasma are obviously desirable or essential in a large variety of applications including negative ion sources for accelerators and more specifically, in plasma assisted semiconductor processing applications referred to in greater detail below.

Basic problems of the type referred to above are also noted in the prior art references discussed below. In any event, the following discussion of the prior art and the following description of the present invention, partially based upon a comparison with the prior art, are intended to further demonstrate novelty in the method and apparatus of the present invention for overcoming problems or obstacles such as those generally referred to above and discussed in greater detail below.

In the semiconductor processing application referred to above, plasma sources employing electron cyclotron resonance (ECR) heating comprise an emerging or developing technology, for example in the deposition and etching of VLSI films. Such applications are typical of other processing technologies requiring the capability of achieving submicron feature dimensions, substantial processing rates and the capability of uniformly processing large specimens such as wafers. The general characteristics of these technologies are believed to be well understood by those skilled in the art and are accordingly not discussed in substantial detail herein.

As noted above, although the ECR plasma source of the present invention is contemplated for use in vapor deposition or etching applications, the general parameters of those applications are not of themselves a portion of the invention. Certain considerations in such applications are briefly summarized below in order to facilitate a more complete understanding of the invention.

In any event, ECR plasma sources such as those provided by the present invention and the prior art discussed below employ magnetic fields and microwave power to create chemically active plasmas, preferably at very low gas pressures. Low pressure operation is desirable in order to permit the formation of highly directional or anisotropic streams of low-temperature ions which are uniform over substantial transverse dimensions larger than the sample being processed.

In an ECR plasma source designed for plasma-enhanced chemical vapor deposition or reactive ion etching of VLSI films, for example, a reactant gas is introduced into an evacuated chamber which is immersed in a steady magnetic field and exposed to electromagnetic radiation. The frequency of the radiation, $f_1$, is selected to resonate with the electron gyrofrequency in a region of the steady magnetic field called the resonant interaction region. The resonance condition relates the strength of the steady magnetic field in this region, $B_1$, through the condition that $f = eB/2\pi m$, where e and m are the magnitudes of the electric charge and mass of the electron, respectively.

Electrons in the resonant interaction region gain kinetic energy from the electromagnetic radiation, and if the radiation power and the gas pressure are suitably adjusted, the heated electrons may ionize the reactant gas molecules to create a plasma. The plasma ions and electrons flow out of the resonant interaction region and impinge on the VLSI film where the ions can be used for deposition of new materials or etching of existing films. If the plasma density of sufficiently high, the deposition or etch rates can be rapid, and if the ion and electron energies are sufficiently low, damage to the sample being processing prevented. For etching submicron-scale features, it is necessary for the ion trajectories to be highly directional. This is made possible by operating at sufficiently low gas pressures to ensure that the ion mean-free-path for scattering is longer than the distance to the specimens.

In order to process specimens of commercial interest, it is further necessary that the stream of plasma from the ECR source be uniform over transverse dimensions larger than 15–20 cm. The present invention, as described below, addresses the need for large, uniform streams of low-temperature plasmas with high densities of ions and electrons in low-pressure neutral gas mixtures.

In the prior art, one class of ECR plasma sources is generally referred to as the "Sumitomo source". The Sumitomo source is illustrated for example by the plasma deposition apparatus of Matsuo, et al. U.S. Pat. No. 4,401,054 issued Aug. 30, 1983, and further discussed in S. Matsuo, M. Kiuchi and T. Ono, in *Proceedings of the Tenth Symposium on IISIAT* 1986, Tokyo, p. 471 and T. Ono, M. Oda, C. Takahashi and S. Matsuo, *J. Vac. Sci. Technol.* B4, 696 (1986).

In the apparatus of that patent, plasma flows toward the substrate or specimen along magnetic lines of force. As discussed below, it is very difficult to achieve a desired degree of spatial uniformity in the cold-plasma density. Furthermore, since electrons heated at the resonant interaction region (bounded or defined by the surface where the magnetic intensity satisfies the aforementioned resonance condition) flow directly toward the specimen along these magnetic lines of force, it is necessary to limit applied microwave power in order to avoid the creation of unstable bursts of energetic electrons which might damage the specimen.

Related prior art references include U.S. Pat. No. 4,492,620 issued Jan. 8, 1965 to Matsuo, et al. and entitled "Plasma Deposition Method and Apparatus" and U.S. Pat. No. 4,564,997 issued Jan. 21, 1986 to Matsuo, et al. and entitled "Semiconductor Device and Manufacturing Process Thereof".

The above three patents issued under assignment to Nippon Telegraph & Telephone Public Corporation. Still other related references issued common assignment include U.S. Pat. No. 4,450,031 issued May 22, 1984 to Ono, et al. and entitled "Ion Shower Apparatus"; U.S. Pat. No. 4,503,807 issued Mar. 12, 1985 to Nakayama, et al. and entitled "Chemical Vapor Deposition Apparatus"; and U.S. Pat. No. 4,566,940 issued Jan. 28, 1986 to Itsumi, et al. and entitled "Manufacturing Process for Semiconductor Integrated Circuits".

Another design of a plasma source (of a very different fundamental nature) originated in France and was disclosed in U.S. Pat. No. 4,534,842 issued Aug. 13, 1985 to Arnal, et al. and entitled "Process and Device for Producing a Homogeneous Large-Volume Plasma or High Density and of Low Electronic Temperature". In the process and device of that patent, plasma was accumulated in a large volume free of magnetic fields to enhance spatial uniformity; however, the ECR heating region was localized to a small volume limiting the efficiency of plasma generation and thus the ratio of ion density to neutral gas density. Furthermore, energetic charged particles were prevented from striking the sample by a magnetci barrier that reduced the flux of plasma to the sample.

Related references disclosing various concepts for ion sources include U.S Pat. Nos. 3,571,734 issued Mar. 23, 1971; 3,774,001 issued Nov. 20, 1973; 3,790,787 issued Feb. 5, 1974; 4,417,178 issued Nov. 22, 1983; and 4,638,216 issued Jan. 20, 1987.

Still another set of references disclosed various designs for ion sources and included U.S. Pat. Nos. 3,500,077 issued Mar. 10, 1970; 3,582,849 issued Jun. 1, 1971; 3,660,715 issued May 2, 1972; 3,663,360 issued May 16, 1972; and 3,742,219 issued Jun. 26, 1973.

All of the above references as well as references cited therein are incorporated herein in order to assure a more complete understanding of the background for ECR plasma sources and applications therefor.

Accordingly, as was also noted above, there has been found to remain a need for ECR plasma sources useful in a variety of applications and capable of producing large, uniform streams of low-temperature plasmas with high densities of ions and electrons, especially in low-pressure neutral-gas mixtures in order to assure unidirectionality or anisotropy of the plasma flow or flux.

SUMMARY OF THE INVENTION

It is therefore an object of the present invention to provide a method and apparatus for producing plasma by means of electron cyclotron resonant heating while overcoming one or more problems of the type generally referred to above and also achieving one or more related advantages.

It is a further object of the invention to provide a method and apparatus for producing plasma by means of electron cyclotron resonance heating either for use in applications such as chemical vapor deposition and etching or other applications such as a negative ion source wherein a plasma source chamber is formed as a symmetrical cylinder having a longitudinal axis with an outlet at one axial end of the chamber and means for introducing a gaseous medium into the chamber. Magnetic field forming magnets are arranged circumferentially about the chamber for forming continuous field force lines annularly extending about the chamber and for producing a resonant interaction envelope within the chamber. Within this combination, microwave power is injected into the plasma forming chamber along an injection axis extending perpendicularly to the longitudinal chamber axis and perferably in radial relation thereto so that plasma electrons made energetic by interaction with the power source are not permitted line-of-sight communication along magnetic lines of force to the outlet.

More preferably, the microwave power is injected into the chamber in manners selected so that resulting energetic electrons are caused either to experience multiple collisions with the magnetic field force lines or to precess in annular magnetic mirror regions formed by the circumferentially arranged magnets. The precessional motion of charged particles in magnetic mirror configurations was discussed at length in books such as *Plasmas and Controlled Fission* by David J. Rose and Melville Clark, Jr., John Wiley & Sons, N.Y., 1961, particularly pp. 215-221. This configuration greatly enhances the likelihood of collision of the energetic electrons with gas atoms in order to result in a substantial increase in plasma density even with low gas pressure in the plasma forming chamber.

Gas pressure within the plasma forming chamber is preferably maintained at a low level, for example, below about $10^{-5}$ to above about $10^{-4}$ Torr, in order to assure unidirectionality or anisotropy in the plasma flow as discussed in greater detail below.

Within a plasma chamber formed as described above, a magnetic field free region is preferably formed between the plasma forming chamber and the outlet in order to permit the plasma to develop uniformity over substantial transverse dimensions.

With the plasma source being employed for chemical vapor deposition or etching, specimens to be coated or etched are arranged in communication with the outlet so that the substantial transverse dimensions containing plasma with high uniformity are larger than the specimens in order to assure uniform treatment across the entire surface of the specimen.

Thus, the method and apparatus of the present invention have been found to produce a plasma stream having a substantial plasma density resulting in an ion flux or current density much greater than has been available in the prior art. At the same time, uniformity of plasma distribution for the plasma stream is achieved within the magnetic field free region referred to above. Even further, with low gas pressure being maintained in the plasma source chamber, unidirectionality or anisotropic plasma characteristics are also maintained in the plasma stream in order to further facilitate applications for achieving submicron feature dimensions as discussed above and for other applications as desired.

Within the above combination, a microwave power source preferably includes a slotted wave guide circumferentially arranged about the chamber for producing more symmetrical and uniform microwave power levels in the chamber. Furthermore, the microwave power source is located in a region of magnetic intensity that is greater than in the resonant interaction region (64 below) to permit the formation of high plasma density wherein the electron plasma frequency greatly exceeds the electron gyrofrequency, a condition generally referred to as "over-dense operation".

Additional features are also preferably employed in the method and apparatus of the invention to further enhance various characteristics of the plasma stream produced at the outlet of the chamber.

For example, the microwave power source is preferably arranged in association with the circumferential magnetic field forming magnet means so that a substantial portion of resulting energetic electrons are caused to precess in annular magnetic mirror regions extending continuously about the symmetrical chamber. In this manner, energy in the energetic electrons resulting from interaction with the microwave power source is efficiently converted to plasma by interaction of the precessing electrons with gas atoms in order to maximize plasma density even with the preferred relatively low gas pressures in the chamber.

Annular impurity trapping recesses are also preferably formed adjacent the circumferentially arranged magnet means for receiving energetic electrons leaking from the annular magnetic mirror regions. Additional means are associated with the impurity trapping recesses for preventing the energetic electrons from returning to the chamber, for example, by means of dielectric and/or cryogenic surfaces in the recesses either for the reduction of sputtering of impurities from the recess walls or for causing the energetic electrons to recombine with ions and adhere to the cryogenic surfaces. Resulting gas would also be removed from the impurity trapping regions while preventing it from returning to the chamber, for example, by means of vacuum pumps in communication with the impurity trapping recess or recesses.

Preferably in association with the impurity trapping recesses, the circumferential magnet means also preferably include means tending to close the magnetic field force lines tightly thereabout both for purposes of minimizing leakage of energetic electrons from the annular magnetic mirror regions and also to minimize random field force lines from undesirably extending into certain portions of the chamber, particularly the magnetic field free region noted above.

The method and apparatus of the present invention are capable of producing a plasma stream with a current density greatly in excess of ten milliamperes per square centimeter (10 mA/cm$^2$) and, more specifically, a current density at least about one hundred milliamperes per square centimeter (100 mA/cm$^2$). By contrast, prior art plasma sources have only been capable of generating plasma streams with current densities of no more than ten milliamperes per square centimeter. For example, the Sumitomo source described in Matsuo, et al. U.S. Pat. No. 4,401,054 noted above was described as being capable of generating or producing a plasma stream with about nine milliamperes per square centimeter. That value is believed to be representative of prior art.

Furthermore, in prior art references emphasizing uniformity of plasma density, considerably lower ion fluxes were encountered. The present invention contemplates generating a plasma stream with a high ion flux or current density but also a plasma stream which is, at the same time, highly uniform in plasma density, because of the magnetic field free region referred to above, and unidirectional or anisotropic at least when low gas pressures are maintained within the chamber.

The ability to produce high current density even at low gas pressures is made possible because of efficiency in the present invention resulting from precessing of energetic electrons about the symmetrical, cylindrical chamber in order to enhance conversion of the microwave power into cold plasma through interaction of the precessing electrons with gas atoms.

Additional objects and advantages of the invention are made apparent in the following description having reference to the accompanying drawings.

BRIEF DESCRIPTION OF THE DRAWINGS

FIG. 1 is an axially sectioned generally schematic representation of a plasma forming chamber constructed in accordance with the present invention and particularly adapted for use in chemical vapor deposition or etching of specimens such as VLSI wafers, sectioning lines being omitted for clarity.

FIG. 2 is a similar view of another embodiment of the plasma forming apparatus of the present invention adapted for use in other applications such as a negative ion source.

FIG. 3 is a graphical representation of three basic functions of the reaction rate constants for excitation and ionization of argon gas, referred to along with FIGS. 4 and 5 in connection with "Aspects of Downstream ECR Cold-Plasma Sources Affecting the Uniformity of Large-Volume, High-Density Plasma."

FIG. 4 is similarly a graphical representation of argon gas density and electron temperature illustrated for two values of characteristic chamber length.

FIG. 5 is a graphical representation comparing microwave power density and electron density under different operating parameters.

DESCRIPTION OF THE PREFERRED EMBODIMENT

The following descriptive material is divided into two sections including (a) an initial detailed description of the plasma forming apparatus and method of operation contemplated by the present invention. Thereafter, a theoretical section (b) is provided to further enhance understanding of the invention. That section includes two subsections entitled "Theoretical Background Considerations" and "Some Theoretical Aspects of Downstream ECR Cold-Plasma Sources Affecting the Uniformity of Large-Volume, High-Density Plasma".

All of these portions of the description are believed to emphasize various advantages of the invention. In particular, the last theoretical subsection noted above emphasizes advantages of the present invention relative to a representative prior art plasma source, namely the Sumitomo source referred to above.

Referring now to the drawings and particularly to FIG. 1, a novel electron cyclotron resonance plasma source constructed according to the present invention is indicated at 10 and is contemplated for producing or generating a large diameter or cross-sectional stream of uniform, low-temperature plasma, at least when low background gas pressures are maintained in the plasma source or chamber.

The plasma source 10 comprises a chamber or enclosure 12 which is preferably a cylinder symmetrical about its longitudinal axis 14 for purposes described in greater detail below.

Neutral reactant gas mixtures are introduced into the chamber 12 in a generally conventional manner from a source 16.

The chamber 12 is also provided with high-speed vacuum pumps schematically indicated at 18 and adapted for maintaining low background gas pressure within the chamber in a preferred operating range of about $10^{-5}$–$10^{-4}$ Torr. The purpose for the preferred low pressure background gas is also discussed in greater detail below.

Symmetric magnetic field force lines are formed within the chamber 12 by a plurality of cylindrical arrays of permanent magnets generally indicated at 20. In particular, two cylindrical magnet assemblies 22 and 24 are arranged about the circumference of a plasma forming portion 26 for developing magnetic field force lines which are configured as cylindrical lobes.

Three lobed magnetic field force lines are indicated at 28, 30 and 32 for the cylindrical magnetic assembly 22. Similarly lobed magnetic field force lines 34, 36 and 38 are illustrated for the other cylindrical magnetic assembly 24.

It is important to note that the magnet assemblies 22 and 24 are cylindrical and generally symmetrical about the circumference of the chamber 12 so that each adjacent pair of lobed magnetic field force lines, principally those indicated at 28, 30 and 34, 36 form annular magnetic mirror regions indicated respectively at 40 and 42. Those regions are shown with cross hatching in order to better emphasize the locations of the magnetic mirror regions 40 and 42.

A microwave power source 44 is arranged between the magnet arrays 22 and 24 adjacent the plasma forming portion 26 of the chamber. Preferably, the microwave power source 44 is provided with a slotted wave guide 46 through which the microwave power is introduced into the plasma forming portion 26 of the chamber. In any event, the microwave power is introduced along multiple injection axes indicated by the arrows 48 which extend perpendicular to the chamber axis 14.

The slotted wave guide 46 novelly causes the microwave power to be uniformly introduced about the entire periphery of the chamber. In addition, because of the symmetrical construction of the chamber, the injection axes 48 are all radially arranged relative to the longitudinal axis 14. Furthermore, the magnetic intensity decreases from a local maximum at the location of the slotted wave guide to the resonant value so as to permit over-dense operation as described above.

Before describing interaction of the microwave power source 44 and the cylindrical magnet assemblies 22 and 24 in greater detail, it is noted that an outlet 50 is formed at one axial end of the chamber 12. The other axial end of the chamber 12 is closed by a wall 52 and an additional permanent magnet array 54 which assists in developing the magnetic field within the plasma forming portion 26 of the chamber. In addition, the magnet array 54 conventionally forms magnetic insulation for the end wall 52. A similar insulating function is also performed by the cylindrical magnet array 20 and particularly the cylindrical magnet assemblies 22 and 24.

With the microwave power source 44 arranged as described, it is important to note that energetic electrons formed by interaction of the microwave power with background plasma existing in the chamber are prevented from direct line-of-sight communication with the specimens 56. Rather, the energetic electrons formed by the microwave power may be considered in two classes. A first class of the energetic electrons tends to enter the central region of the plasma forming chamber portion 26 where they impinge or collide with field force lines such as those indicated at 28–30. Energetic electrons in this first class thus tend to bounce back and forth laterally within the plasma forming chamber portion 26 until they eventually interact or collide with neutral gas atoms and degrade to assist in increasing density of the cold plasma.

The second class of energetic electrons is dependent upon the arrangement of the microwave power source 44 adjacent and preferably intermediate the two cylindrical magnet assemblies 22 and 24. This second class of energetic electrons is captured within magnetic mirror regions such as those indicated at 40 and 42.

Because of the annular or continuous nature of the magnetic mirror regions, energetic electrons in the so-called second class continuously travel about the annular path formed by the magnetic mirror regions in a process commonly referred to as "precessing". In any event, with these energetic electrons precessing about the annular or continuous magnetic mirror regions, they tend to remain trapped therein until they also collide with neutral gas atoms whereupon they also degrade to further assist in increasing the density of the cold plasma within the plasma forming chamber portion 26.

In any event, the symmetrical configuration of the cylindrical chamber 12 together with the interacting arrangement of the cylindrical magnet assemblies 22, 24 and the microwave power source 44 produces great efficiency in converting the microwave power into cold plasma while also preventing line-of-sight communication of the energetic electrons with the specimens 56 as noted above.

With the plasma source 10 of FIG. 1 being preferably adapted for use in chemical vapor deposition or etching, for example, a wafer 56 is arranged upon a holder 58 in communication with the outlet 50. At the same time, a magnetic field free region 60 is formed in the chamber 12 intermediate the plasma forming chamber portion 26 and the outlet 50. Insulating magnets 62 are also arranged about the circumference of the magnetic field free region 60 in order to prevent plasma in the region 60 from colliding with adjacent wall portions of the chamber.

In accordance with conventional electron cyclotron resonance heating practice, the microwave power source 44 and the magnets are adapted for producing a resonant interaction region generally indicated as a continuous surface at 64. As illustrated in FIG. 1, the resonant heating region 64 extends substantially into the plasma producing chamber portion 26 while being absent from the magnetic field free region. It is of course to be understood that energy in energetic electrons passing through the resonant region 64 is increased.

Generally, the first class of energetic electrons referred to above tends to pass through the region 64 only once and thereafter to remain in a central portion of the plasma forming chamber 26 until interacting with gas atoms as described above.

The second class of energetic electrons which precess in the magnetic mirror regions have their energy levels greatly increased since they are capable of passing through the resonant region 64 numerous times while precessing about the circumference of the chamber. For that reason, the magnets are designed so that the resonant heating envelope 64 preferably intersects the magnetic mirror regions 40 and 42 in order to achieve amplified energy levels for the energetic electrons therein.

Since some energetic electrons may tend to "leak" out of the magnetic mirror regions 40 and 42 toward the cylindrical walls of the chamber 12, impurity trapping recesses 66 and 68 are annularly formed adjacent the cylindrical magnet assemblies 22 and 24. Thus, any energetic electrons and accompanying ions tending to leak out of the magnetic mirror regions 40 and 42 enter into the recesses 66 and 68. Here again, energetic electrons in the recess 66 are prevented from line-of-sight communication with the outlet 50 by means of an annular deflector 70 generally arranged between the recess 66 and the magnetic field free region 60. Wall surfaces in the recesses 66 and 68 are preferably formed from a suitable dielectric material in order to minimize sputtering of wall material.

The invention also contemplates providing means either in or in communication with the recesses 66 and 68 to further prevent the energetic electrons or impurities within the recesses 66 and 68 from entering the plasma forming chamber portion 26. For example, cryogenic surfaces 72 may be formed in the recesses for trapping the energetic electrons and impurities for that region. Alternatively, high vacuum sources (not shown) could be arranged in communication with the recesses 66 and 68 for the same purpose.

In addition to trapping energetic electrons in the recesses 66 and 68, the cylindrical magnet assemblies 22 and 24 are also preferably configured for closing their magnetic field force lines more tightly about the magnet assemblies in order to also minimize such leakage. For that purpose, each of the cylindrical magnet assemblies 22 and 24 is formed with a principle cylindrical magnet 74 or 76 generally facing the plasma forming chamber portion 26. Additional paired magnets 78, 80 and 82, 84 are arranged behind the principle magnets with their polar axes diagonally oriented as illustrated by the arrows so that the magnetic field force lines are closely drawn about the magnet assemblies as illustrated in FIG. 1.

At the same time, the cylindrical magnet assemblies 22 and 24 also prevent the magnetic field force lines from extending into the magnetic field free region 60 so that it is better able to accomplish its function.

It is generally believed that the mode of operation for the plasma source 10 will be apparent to those skilled in the art from the preceding description. However, the method of operation is described briefly below in order to assure a complete understanding of the invention.

In operation, referring again to FIG. 1, energetic electrons are initially formed by interaction of microwave power from the source 44 with background plasma initially present in the plasma forming portion 26 of the chamber. Two classes of energetic electrons are formed as described above, both of which are prevented from direct line-of-sight communication with the outlet 50.

Because of the design of the cylindrical chamber 12, the magnets and the microwave power source, high efficiency is accomplished in conversion of energetic electrons to increase the density of the cold plasma. Furthermore, with low pressure being maintained in the chamber, the plasma is also unidirectional or anisotropic as also discussed above. As cold plasma flows or streams from the plasma forming chamber portion 26 toward the outlet 50, it passes into the magnetic field free region 60. In that region, because of the substantial absence of magnetic field force lines, the cold plasma expands freely in the transverse direction to become very uniform in density as it approaches the outlet 50. Thus, as plasma streams through the magnetic field free region 60 toward the outlet 50, it is characterized not only by high current density but also by uniformity of plasma density and unidirectionality or anisotropy in order to greatly enhance the carrying out of chemical vapor deposition or etching on the specimen 56.

It is of course to be understood that in carrying out these processes, additional active gases are introduced either initially with the inert gas or subsequently, possibly in the magnetic field free region so that the plasma is capable of performing its normal functions in those applications.

It is also to be understood that a method and apparatus for generating or producing plasma by electron cyclotron resonant heating in accordance with the present invention may be useful in other applications. As illustrated in FIG. 2, the plasma source of the present invention is illustrated for use as a negative ion source. Referring now to FIG. 2, substantially all components within the plasma source are similar to the components described above for the plasma source of FIG. 1. Accordingly, the plasma source of FIG. 2 is indicated at 10' and all of the components therein are indicated by primed numerals corresponding to numerals labeling corresponding components in the plasma source of FIG. 1.

However, in the plasma source 10' of FIG. 2, a magnetic grid 86 replaces the specimen holder 58. Otherwise, the plasma source 10' and cylindrical chamber 12' function as described above for producing a high current density, uniform and unidirectional plasma stream of substantial cross-section in the magnetic field free region 60' which passes through the magnetic grid 86.

Accordingly multiple embodiments and methods of operation have been described above for the plasma source of the present invention. Novelty in features of the invention as described above are further emphasized by the following theoretical discussion which is set forth for purposes of explanation and not to limit the invention.

THEORETICAL BACKGROUND CONSIDERATIONS

Since the thermal velocity of the electrons greatly exceeds that of the ions, and since the plasma must remain electrically neutral throughout its volume, ambipolar electric fields will be established spontaneously so as to reduce electron flow and enhance ion flow toward the specimen (56 above). The net axial ambipolar flow speed of both species is predicted to equal the ion acoustic speed, $C_s$, given by $$C_s = \sqrt{T_e/M_i}.$$

The corresponding ion flux is $\Gamma_i = n_i c_s$; and the equivalent ion current density is $j_i = e\Gamma_i$. If the source is to achieve adequate processing rates, it must provide an equivalent ion current density onto the specimen exceeding 0.01 A/cm². If the plasma electron temperature is around 4 eV and the plasma ion density exceeds $2 \times 10^{12}$ ions/cm³, the equivalent ion current density is predicted to exceed 0.1 A/cm.

A major advantage of the invention is the creation of plasma at the resonant interaction region with densities much greater than the cut-off value, $n_c$, where $$n_c = m\epsilon_0(2\pi f/e)^2,$$

and $\epsilon_0$ is the permittivity of free space. The creation and maintenance of over-dense plasmas is made possible by the novel way in which the high-frequency electromagnetic fields are coupled into whistler waves propagating from regions of higher magnetic intensity. The whistlers propagate along magnetic lines of force that do not intersect the specimen, so that electrons accelerated by the waves are prevented from streaming directly into the sample, even with very high microwave power. The importance of this feature can be realized by considering the factors that govern the density of the plasma.

In a subsequent section, a simplified point model of the plasma equilibrium demonstrates some of the key dependences of the plasma density, temperature, neutral gas pressure, and applied microwave power for the class of electrons that flow directly into the central chamber. However, some of the most immediate aspects of this model relative to the magnetically-confined electrons are considered below.

The rate at which energetic electrons are created, $\dot{n}_e$, is governed by the microwave power density, $P_\mu$:

$$\dot{n}_e = \hat{P}_\mu / \omega_e,$$

where $\omega_e$ is the average energy of the energetic electrons. The resulting density of energetic electrons, $n_e$, is determined by the average lifetime, $\tau_e$:

$$n_e = \dot{n}_e \tau_e = \hat{P}_\mu \tau_e / \omega_e.$$

The lifetime of energetic electrons confined by the magnetic-mirror effect is given approximately by $$\tau_e \approx 3.5 \times 10^4 \omega_e^{3/2} (n_e \lambda/10)^{-1} \text{ sec eV}^{-3/2} \text{ cm}^{-3}$$

Here, $\lambda$ is the Coulomb logarithm given by $$\lambda = 24 - \ln(n_e^{\frac{1}{2}} T_e^{-1}).$$

The density of energetic electrons is then determined by the microwave power and the average electron energy according to $$n_e = \left[ \frac{3.5_\mu \times 10^4 \omega_e^{1/2} \text{sec eV}^{-3/2} \text{cm}^{-3}}{(\lambda/10)} \right]^{1/2}$$

For example, if $\hat{P}_\mu = 1\omega/\text{cm}^{-3}$ and $\omega_e = 10$ eV, and if $\lambda/10 \sim 1.5$, then $$n_e \approx 1.2 \times 10^{12} \text{cm}^{-3}.$$

Furthermore, provided the average electron energy remains near 100 eV, the energetic electron density increases as the square root of the microwave power density. The novel microwave coupling concept used in the present invention permits very high microwave power densities to be used without causing unstable bursts of energetic electrons to strike the specimen and cause damage to the wafer.

The energetic electrons create secondary ion-electron pairs at a rate, $\dot{n}_i$, given by $$\dot{n}_i = n_e n_0 \langle \sigma V_e \rangle_i$$

where $n_o$ is the density of neutral gas and $\langle \sigma V_e \rangle_i$ is the electron-impact ionization rate constant averaged over the distribution of energetic electrons. For argon gas, for example, this rate constant has its maximum value for electron temperatures around 100 eV, where it approaches $2 \times 10^{-7}$ cm$^3$/sec. If $\tau_i$ is the average residence time for ions in the chamber, the ion density, $n_i$, is approximated by the equation:

$$n_i = \dot{n}_i \tau_i = n_e n_0 \langle \sigma V_e \rangle_i \tau_i.$$

$\tau_i$ is estimated roughly as $L/c_s$, where L is the axial length of the chamber, and $c_s$ is the ion acoustic speed. The corresponding ion flux is $$\Gamma_i = n_i c_s = n_e n_0 L \langle \sigma V_e \rangle_i.$$

In order to achieve highly directional ion flow, the product $n_0 L$ is limited to remain below a critical level set by the ion scattering cross section, $\sigma_{scatt}$; namely, $$n_0 L << \sigma_{scatt}^{-1}.$$

An upper limit on the ion flux is then given approximately by $$\Gamma_i \leq \left[ \frac{3.5 \hat{P}_\mu \times 10^4 \omega_e^{1/2} \text{sec} \cdot \text{eV}^{-3/2} \cdot \text{cm}^{-3}}{(\lambda/10)} \right]^{1/2} \frac{\langle \sigma V_e \rangle_i}{10 \sigma_{scatt}}$$

For the illustrative case of argon, $\sigma_{scatt} \sim 10^{-14}$ cm$^2$; and then $$\Gamma_i \leq 2.4 \times 10^{18} \sqrt{\hat{P}_{\mu,w/cm3}} \frac{\text{ions}}{\text{cm}^2\text{sec}}$$

corresponding to an equivalent current density of $$j_i \leq 0.38 \, A/\text{cm}^2 \sqrt{\hat{P}_{\mu,w/cm3}}$$

Here, $\hat{P}_{\mu,w/cm3}$ in the microwave power density in Watts/cm$^3$.

Understanding of the present invention is believed further facilitated by a theoretical comparison of operating functions of the invention contrasted with the prior art, specifically the Sumitomo source referred to above.

ASPECTS OF DOWNSTREAM ECR COLD-PLASMA SOURCES AFFECTING THE UNIFORMITY OF LARGE-VOLUME, HIGH-DENSITY PLASMA

Some of the fundamental relations governing the properties of cold-plasma stream generated in downstream ECR plasma sources, such as the Sumitomo source, are discussed herein. From a consideration of the conditions for particle and power balance, it becomes clear that this approach to generating large volumes of high-density plasma with a high degree of spatial uniformity encounters two major obstacles. Stated simply, these obstacles are the requirement that the neutral gas density supplying the plasma and the microwave radiation used for electron cyclotron heating must be uniform across the cross section of the discharge. Local particle and power-balance equations are applied to establish the relations between neutral gas density, microwave power, electron (and ion) density and electron temperatures.

The analysis is carried out in the following manner:

1) The plasma parameters are assumed to characterize the conditions on an arbitrary magnetic line of force, where rapid averaging is accomplished by free motion of electrons and ions parallel to the magnetic field;

2) The rate at which ion-electron pairs are produced is governed by the ambient neutral gas density, $n_o$, the local electron density, $n_e$, and the average ionization rate constant, $<\sigma V_e>_i$, which depends on the type of gas under consideration and the local electron temperature, $T_e$; the corresponding power (per cubic centimeter) is denoted $\hat{P}_i$;

3) Excitation of the gas atoms leads to a radiative loss of power that is estimated from $n_o$ and $n_e$ using an averaged excitation rate constant, $<\sigma V_e>_x$, that again depends on the type of gas and the electron temperature;

4) Charged particles and the kinetic energy associated with them are assumed to be lost from the source region by ambipolar flow along the magnetic lines of force at the ion acoustic speed, $c_s$;

5) As is shown in the following, the condition that the generation rate of ion-electron pairs balance the ambipolar loss rate relates the electron temperature to the neutral gas density;

6) Similarly, the balance between microwave power absorbed (per cubic centimeter), $P_\mu$, and the power required for ionization and excitation of the gas atoms relates the plasma density to the microwave power.

Thus, the governing equations determining the self-consistent values of the plasma parameters are particle balance and power balance for each species. For the electrons, these are set forth as follows:

$$\frac{dn_e}{dt} = n_e n_o <\sigma V_e>_i - \frac{n_e}{\tau_e}.$$

and $$\frac{d}{dt}\left[\frac{3}{2} n_e T_e\right] = \hat{P}_\mu - \hat{P}_x - \hat{P}_i - \frac{3 n_e T_e}{2 \tau_E}.$$

Here, $n_e$ and $n_o$ are the local values of electron and neutral gas densities, $<\sigma V_e>_i$ is the ionization rate coefficient averaged over the electron distribution, $\tau_e$ and $\tau_E$ are the particle and energy confinement times, and $P_\mu$, $P_x$ and $P_i$ are power densities associated with the absorption of microwave power and the excitation and ionization of gas atoms, respectively:

$$\hat{P}_x = n_e n_o <\sigma V_e>_x E_x$$

and $$\hat{P}_i = n_e n_o <\sigma V_e>_i E_i$$

As an approximate rough model of the confinement times for the cold plasma that streams directly into the central chamber, it is postulated that $$\tau_e \sim 2\tau_E \sim L/c_s,$$

where $$c_s = \sqrt{2T_e/M_i}$$

is the ion acoustic speed, and L is a characteristic length that must be determined separately. In steady state, then $$n_o <\sigma V_e>_i \tau_e = 1$$

and $$\frac{\hat{P}_\mu}{n_e} = \frac{3 T_e}{2 \tau_E} + n_o(E_x <\sigma V_e>_x + E_i <\sigma V_e>_i).$$

For an assumed lifetime, $\tau_e$, $$n_o = \frac{\sqrt{T_e}}{<\sigma V_e>_i} \frac{c}{L} \sqrt{2/M_i c^2}$$

from which it is concluded that the electron temperature is determined by the local neutral gas density. Substituting this expression for $n_o$ into the power balance equation leads to a relation between microwave poser density and electron density:

$$\frac{\hat{P}_\mu}{n_e} = \frac{3 T_e}{2 \tau_e} + \frac{1}{\tau_e}\left[\frac{E_x <\sigma V_e>_x}{<\sigma V_e>_i} + E_i\right],$$

from which it is concluded that the electron density is determined largely by the microwave power density, given the value of electron temperature as dictated by the neutral gas density.

The key function, $$\sqrt{T_e}/<\sigma V_e>_i,$$

relating neutral density and electron temperature, is plotted against electron temperature for argon gas (indicated at 92) in FIG. 3, using ionization rate coefficient data from R. L. Freeman and E. M. Jones, "Atomic Collision Processes in Plasma Physics Experiments", CLM-R 137, Culham Laboratory (1974). The corresponding values of argon gas density and electron temperature are shown for three values of the characteristic length, L, in FIG. 4.

For $(n_o, T_e)$ values that satisfy the steady-state particle balance condition, the ratio of microwave power condition, the ratio power density to electron density, $\hat{P}_\mu/n_e$, can be evaluated from the condition for steady-state power balance (see above). The total energy loss rate per neutral atom due to excitation and ionization is indicated at 94 in FIG. 3. Excitation rate coefficients are calculated from $$<\sigma V_e>_x = 2.64 \times 10^{-7} \frac{T_e}{T_e + 11eV} \exp\left[\frac{-11eV}{T_e}\right]\frac{cm^3}{sec}$$

It is estimated that $E_x = 11$ eV and $E_i = 15$ eV. The ratio of the excitation and ionization reaction rate coefficients for argon are displayed as indicated at 96 in FIG. 3.

From the value of the electron temperature for steady-state particle balance plotted against $n_o$ in FIG. 4, $T_e$ can be a double-valued function of $n_o$; and for $n_o$ less than a critical value determined by L and the particular type of gas used, there are no steady-state solutions. A few illustrative cases of electron density versus $P_\mu$ are shown in FIG. 5 for different values of electron temperature (and thus neutral density).

In order to illustrate some aspects of the double-valued nature of $T_e(n_o)$, consider the case $L = 10$ cm and $n_o = 1.3 \times 10^{12}$ cm$^{-3}$, for which particle balance can be maintained with $T_e = 28$ eV or 130 eV. For the low-temperature case, $$n_e = \frac{4.6 \times 10^{11}}{\text{Watt}} \hat{P}_\mu; (T_e = 28\text{eV}).$$

whereas for the high-temperature case $$n_e = \frac{5.9 \times 10^{11}}{\text{Watt}} \hat{P}_\mu; (T_e = 130\text{eV}).$$

Thus, for a given power density, one can have either low-temperature/high-density equilibrium or high-temperature/low-density equilibrium. As the neutral gas density increases, the difference in the two possible equilibria increases.

To recapitulate, the two main findings deduced from this point model are:

1) the local electron temperature is governed by the local neutral density; and
2) the local electron density is governed by the local microwave power density.

To achieve uniformity in $n_e$ and $T_e$ in a downstream source, such as the Sumitomo source, it therefore appears necessary to achieve uniform neutral density and microwave power deposition throughout the cross section of the plasma. Uniform distributions of neutral density and microwave power are difficult to achieve in large-volume high-density plasmas since complex transport phenomena govern the penetration of neutral atoms and electromagnetic radiation.

For power densities around 1 $\omega/\text{cm}^3$ it may be possible to achieve $n_e \sim n_o$, if the low-$T_e$/high-$n_e$ branch can be selected. It may be difficult to avoid exciting the high-temperature/low-density branch at high power; since strong single-pass electron cyclotron heating at high power is likely to generated high-energy electrons with a high degree of temperature anisotropy. The potential for spontaneous generation of unstable waves under these conditions increases the difficulty of controlling the plasma equilibrium.

Accordingly, various theoretical considerations noted above are believed to further illustrate novelty in the method and apparatus of the present invention as described hereinabove. Various modifications and additions to the method and apparatus are believed apparent in addition to those specifically described above. Accordingly, the scope of the present invention is defined only by the following appended claims which are also set forth by way of example.

What is claimed is:

1. An electron cyclotron resonance (ECR) plasma source for use in treating specimens such as VLSI wafers by processes including chemical vapor deposition and etching, comprising
   a cylindrical chamber which is symmetrical about its longitudinal axis,
   means for supporting one of the specimens adjacent one axial end of the cylindrical chamber,
   means for introducing a gaseous medium into the chamber,
   two cylindrical magnet assemblies arranged circumferentially about the chamber for generating a circumferentially continuous and symmetrical magnetic field having lines of force forming continuous annular lobes also circumferentially extending about the chamber and continuous resonant interaction regions encircling the longitudinal axis of the chamber adjacent an opposite axial end thereof,
   means for developing a substantially field free region adjacent the one axial end of the chamber while minimizing extension of magnetic field force lines into the magnetic field free region and toward the specimen,
   a microwave power injector arranged between the magnet assemblies and having multiple injection axes extending radially inwardly toward the longitudinal axis of the chamber and thereby uniformly radiating electromagnetic radiation toward the resonant interaction region about the entire periphery of the chamber so that plasma electrons made energetic by interaction with the electromagnetic radiation are not permitted line of sight communication to the specimen along field force lines in the magnetic field free region, and
   means for maintainig low gas pressure in the chamber,
   whereby a plasma stream flows through the magnetic field free region toward the specimen with characteristics of high plasma density, uniformity over transverse dimensions larger than the specimen, low plasma temperature and absence of energetic particles resulting from plasma instabilities even with operating gas pressures as low as $10^{-5}$ Torr.

2. The ECR plasma source of claim 1 wherein the microwave power injector is further arranged relative to the magnetic field so that resulting energetic electrons are caused either to experience multiple collisions with the magnetic field force lines or to precess in annular magnetic mirror regions formed by the magnet assemblies whereby the likelihood of collision of the energetic electrons with gas atoms is enhanced resulting in increased plasma density at low gas pressure.

3. The ECR plasma source of claim 2 wherein the microwave power injector comprises a slotted wave guide formed circumferentially about the chamber and having its multiple injection axes arranged parallel to lines of magnetic force developed by the magnet assemblies for producing more symmetric and uniform coupling of microwave power in the chamber and for achieving over-dense operation.

4. The ECR plasma source of claim 1 wherein the other end of the chamber is closed and provided with circumferentially extending and circumferentially symmetrical magnet means for developing continuous magnetic field force lines, the microwave power injector and circumferentially continuous magnet assemblies being arranged in a plasma forming portion of the chamber adjacent its other closed end.

5. The ECR plasma source of claim 4 further comprising insulating magnetic means circumferentially continuous about the magnetic field free region to prevent interaction of the plasma with walls of the chamber while avoiding development of magnetic field force lines in the magnetic field free region.

6. The ECR plasma source of claim 5 wherein the microwave power injector comprises a slotted wave guide arranged in an annular recess formed between the two circumferentially arranged magnet assemblies.

7. The ECR plasma source of claim 6 further comprising impurity trapping recesses annularly formed adjacent the magnet assemblies for receiving energetic electrons and accompanying ions leaking from the annular magnetic mirror regions and means for preventing the resulting gas from returning to the chamber.

8. The ECR plasma source of claim 1 wherein the microwave power injector comprises a slotted wave guide arranged circumferentially about the chamber and having multiple injection axes arranged parallel to lines of magnetic force developed by the magnet assemblies for producing more symmetric and uniform coupling of microwave power in the chamber and for achieving over-dense operation.

9. The ECR plasma source of claim 8 further comprising impurity trapping recesses annularly formed adjacent the magnet assemblies for receiving energetic electrons and accompanying ions leaking from the annular magnetic mirror regions and means for preventing the resulting gas from returning to the chamber, the magnet assemblies comprising means tending to close the magnetic field force lines tightly thereabout in order to minimize random field force lines extending into the magnetic field free region.

10. The ECR plasma source of claim 1 wherein the magnet assemblies comprise means tending to close the magnetic field force lines tightly thereabout in order to minimize magnetic field force lines extending into the magnetic field free region.

11. An electron cyclotron resonance (ECR) source for producing a high density plasma, comprising
   a cylindrical chamber which is symmetrical about its longitudinal axis and has an outlet at one axial end thereof,
   means for introducing a gaseous medium into the chamber,
   two cylindrical magnet assemblies arranged circumferentially about the chamber for generating a circumferentially continuous and symmetrical magnetic field having lines of force forming continuous annular lobes also circumferentially extending about the chamber and continuous resonant interaction regions encircling the longitudinal axis of the chamber adjacent an opposite axial end thereof,
   means for developing a substantially field free region adjacent the one axial end of the chamber while minimizing extension of magnetic field force lines into the magnetic field free region,
   a microwave power injector arranged between the magnet assemblies and having multiple injection axes extending radially inwardly toward the longitudinal axis of the chamber and thereby uniformly radiating electromagnetic radiation toward the resonant interaction region about the entire periphery of the chamber so that plasma electrons made energetic by interaction with the electromagnetic radiation are not permitted line of sight communication toward the outlet along field force lines in the magnetic field free region, and
   means for maintaining low gas pressure in the chamber,
   whereby a plasma stream flows through the magnetic field free region toward the outlet with characteristics of high plasma density, uniformity over transverse dimensions larger than the outlet, low temperature plasma and absence of energetic particles resulting from plasma instabilities even with operating gas pressures as low as $10^{-5}$ Torr.

12. The ECR plasma source of claim 11 wherein the microwave power injector comprises a slotted wave guide formed circumferentially about the chamber and having multiple injection axes arranged parallel to lines of magnetic force developed by the magnet assemblies for producing more symmetric and uniform coupling of microwave power in the chamber and for achieving over-dense operation.

13. The ECR plasma source of claim 12, wherein the other end of the chamber is closed and provided with magnet means for developing magnetic field force lines.

14. The ECR plasma source of claim 11 wherein the microwave power injector and circumferentially continuous magnet assemblies are arranged in a plasma forming portion of the chamber adjacent its other closed end and a magnetic field free region is formed adjacent the one axial end of the chamber.

15. The ECR plasma source of claim 14 wherein the means for developing the magnetic field free region comprise insulating magnet means circumferentially extending about the magnetic field free region to prevent interaction of the plasma with walls of the chamber while avoiding development of magnetic field force lines in the magnetic field free region.

16. The ECR plasma source of claim 15 wherein the microwave power injector comprises a slotted wave guide arranged in an annular recess formed between the two magnet assemblies.

17. The ECR plasma source of claim 16 further comprising impurity trapping recesses annularly formed adjacent the magnet assemblies for receiving energetic electrons and accompanying ions leaking from the annular magnetic member regions and means for preventing resulting gas from returning to the chamber.

* * * * *